United States Patent
Roy

(10) Patent No.: US 8,446,755 B2
(45) Date of Patent: May 21, 2013

(54) MULTIPLE CYCLE MEMORY WRITE COMPLETION

(75) Inventor: Richard S. Roy, Dublin, CA (US)

(73) Assignee: MoSys, Inc., Santa Clara, CA (US)

(*) Notice: Subject to any disclaimer, the term of this patent is extended or adjusted under 35 U.S.C. 154(b) by 0 days.

(21) Appl. No.: 13/369,253

(22) Filed: Feb. 8, 2012

(65) Prior Publication Data

US 2012/0140581 A1   Jun. 7, 2012

Related U.S. Application Data

(62) Division of application No. 12/577,994, filed on Oct. 13, 2009, now Pat. No. 8,139,399.

(51) Int. Cl.
  *G11C 11/24* (2006.01)
  *G11C 7/00* (2006.01)
  *G11C 8/00* (2006.01)

(52) U.S. Cl.
  USPC ......... 365/149; 365/189.15; 365/189.16; 365/222; 365/230.03; 365/233.1; 365/236

(58) Field of Classification Search ......... 365/149, 365/189.15, 189.16, 222, 230.03, 233.1, 365/236
  See application file for complete search history.

(56) References Cited

U.S. PATENT DOCUMENTS

| | | | |
|---|---|---|---|
| 3,809,884 A | 5/1974 | Nibby et al. | |
| 5,206,942 A | 4/1993 | Ibi | |
| 5,619,471 A * | 4/1997 | Nunziata | 365/230.03 |
| 6,205,514 B1 * | 3/2001 | Pawlowski | 365/230.03 |
| 6,895,490 B1 * | 5/2005 | Moore et al. | 365/230.03 |
| 7,116,602 B2 | 10/2006 | Klein | |
| 7,154,799 B2 | 12/2006 | Matsuzaki | |
| 7,236,421 B1 * | 6/2007 | Eldridge et al. | 365/230.03 |
| 7,272,066 B2 | 9/2007 | Klein | |
| 7,317,650 B2 | 1/2008 | Shinozaki et al. | |
| 7,898,892 B2 | 3/2011 | Klein | |

* cited by examiner

Primary Examiner — Trong Phan
(74) Attorney, Agent, or Firm — Bever, Hoffman & Harms, LLP

(57) ABSTRACT

A memory system that reduces the memory cycle time of a memory cell by performing an incomplete write operation. The voltage on a storage node of the memory cell does not reach a full supply voltage during the incomplete write operation. The incomplete write operation is subsequently completed by one or more additional accesses, wherein the voltage on the storage node is pulled to a full supply voltage. The incomplete write operation may be completed by: subsequently writing the same data to the memory cell during an idle cycle; subsequently writing data to other memory cells in the same row as the memory cell; subsequently reading data from the row that includes the memory cell; or refreshing the row that includes the memory cell during an idle cycle. One or more idle cycles may be forced to cause the incomplete write operation to be completed in a timely manner.

6 Claims, 10 Drawing Sheets

MULTIPLE CYCLE MEMORY WRITE COMPLETION

RELATED APPLICATIONS

The present application is a divisional of pending U.S. Pat. No. 8,139,399, filed Oct. 13, 2009, entitled "Multiple Cycle Memory Write Completion".

FIELD OF THE INVENTION

The present invention relates to a method for operating a volatile memory system that requires refresh operations. More specifically, the present invention relates to an improved method and structure for performing write operations to a volatile memory system that requires refresh, wherein the memory cycle time is reduced.

RELATED ART

FIG. 1A is a circuit diagram of a conventional dynamic random access memory (DRAM) bit cell 101, which includes PMOS transistor 111 and capacitor 112. A plurality of bit cells, identical to bit cell 101, are typically arranged in a plurality of rows and columns to form a memory array. Each row of bit cells is coupled to a corresponding word line, and each column of bit cells is coupled to a corresponding bit line (BL) in a manner well known to those of ordinary skill in the art. In the illustrated example, the gate of transistor 111 is coupled to a word line WL, and the source of transistor 111 is coupled to a bit line BL. The bit line BL is coupled to a sense amplifier 102. The connecting node between transistor 111 and capacitor 112 within the bit cell 101 will be referred to hereinafter as node N1, or the storage node. DRAM bit cell 101 stores a charge representative of a data bit on storage node N1. Because this charge leaks over time, DRAM bit cell 101 must be periodically refreshed in order to reliably store the data bit. The period at which the refresh operation is performed to ensure the proper retention of the data bit is referred to as the normal refresh interval. In a conventional memory system using DRAM bit cells, a normal refresh interval may be on the order of about 1 msec. If the memory system operates at frequency of 400 MHz, this represents about 400,000 memory access cycles.

For high performance random access memory blocks, a critical issue is how to minimize the time delay between the selection of one word line and another different word line, wherein these word lines are coupled to bit cells that share the same physical bit lines. For the purposes of the present description, this time delay is defined as the minimum memory cycle time. For random access memories, the fastest memory cycle time may be limited by either a normal write or a normal read operation. However, a write operation to a DRAM bit cell is typically slower than a read operation to a DRAM bit cell, because the write operation requires flipping the voltage state of the internal storage node N1 of the DRAM bit cell. A write operation must swing the internal storage node N1 of the bit cell between the extremes of the $V_{SS}$ and $V_{DD}$ supply voltages. The minimum memory cycle time is therefore defined by the write cycle time in a DRAM memory system.

FIG. 1B is a circuit diagram that represents bit cell 101 during a write operation. During the write operation, the voltage on the word line (WL) is controlled to turn on PMOS transistor 111, such that this transistor may be represented by a resistor R.

FIGS. 2A and 2B are timing diagrams 201 and 202 illustrating the key waveforms for memory array write operations to bit cell 101 at a frequency of 400 MHz, or a 2.5 nanosecond (ns) cycle time. FIGS. 2A and 2B illustrate voltages 1.5V, 1.0V, 0.5V, 0V (Vss) and −0.5V. FIG. 2A illustrates the writing of a logic "0" data bit to bit cell 101, wherein bit cell 101 initially stores a logic "1" data bit. Conversely, FIG. 2B illustrates the writing of a logic "1" data bit to bit cell 101, wherein bit cell 101 initially stores a logic "0" data bit. In the illustrated examples, the bit line BL is initially pre-charged to the ground supply voltage $V_{SS}$ (0 Volts). In other examples, it is possible that the bit line BL may be pre-charged to other voltages, such as the positive supply voltage $V_{DD}$, or one-half of the positive supply voltage ($V_{DD}/2$).

The word line WL is driven low (−0.5 Volts) as illustrated by FIGS. 2A and 2B, thereby turning on PMOS transistor 111, such that the bit line BL is connected to the storage node N1. Sense amplifier 102 drives the write data value onto the bit line BL. As a result, the storage node N1 is driven to the voltage on the bit line BL. More specifically, the bit line BL is driven to the ground supply voltage $V_{SS}$ in order to store a "0" level in bit cell 101 (FIG. 2A); and the bit line BL is driven to the positive supply voltage $V_{DD}$ (e.g., 1.15 Volts) in order to store a "1" level in bit cell 101 (FIG. 2B).

In the illustrated examples, the memory cycle time of 2.5 ns is long enough to ensure that the voltage of storage node N1 reaches the full supply voltage levels of $V_{SS}$ (FIG. 2A) and $V_{DD}$ (FIG. 2B) during a single write cycle.

FIGS. 3A and 3B are timing diagrams 301 and 302, respectively, which illustrate the situation that results if the operating speed of the bit cell 101 is increased to a frequency of 600 MHz, or a 1.67 ns cycle time. FIGS. 3A and 3B illustrate voltages 1.5V, 1.0V, 0.5V, 0V (Vss) and −0.5V. As illustrated in FIGS. 3A and 3B, the storage node N1 does not have sufficient time to be fully charged to the appropriate voltage supply level within a single write cycle. Thus, as illustrated in FIG. 3A, when bit cell 101 initially stores a logic "1" data bit, and a logic "0" data bit is then written to bit cell 101, the storage node N1 is only pulled down to a voltage of about 200 mV (instead of being pulled all the way down to the $V_{SS}$ supply voltage of 0 Volts.) Similarly, as illustrated in FIG. 3B, when bit cell 101 initially stores a logic "0" data bit, and a logic "1" data bit is then written to bit cell 101, the storage node N1 is only pulled up to voltage of about 0.95 Volts, or about 200 mV less than the full $V_{DD}$ supply voltage of 1.15 Volts (instead of being pulled all the way up to the $V_{DD}$ supply voltage of 1.15 Volts.) After the write operation has been completed, it is possible that the data bit stored on the storage node N1 may be successfully read during a short time period that follows the completion of the write cycle. However, the data bit stored on the storage node N1 cannot be reliably read at the end of a normal refresh interval. Thus, it is not possible to operate bit cell 101 at a frequency of 600 MHz using a conventional memory system architecture.

FIGS. 4A and 4B are timing diagrams 401 and 402, respectively, which illustrate the situation that results if the operating speed of the bit cell 101 is further increased to a frequency of 800 MHz, or a 1.25 ns cycle time. FIGS. 4A and 4B illustrate voltages 1.5V, 1.0V, 0.5V, 0V (Vss) and −0.5V. As illustrated in FIG. 4A, when bit cell 101 initially stores a logic "1" data bit, and a logic "0" data bit is then written to bit cell 101, the storage node N1 is only pulled down to a voltage of about 400 mV at the end of the write operation. Similarly, as illustrated in FIG. 4B, when bit cell 101 initially stores a logic "0" data bit, and a logic "1" data bit is then written to bit cell 101, the storage node N1 is only pulled up to voltage of about 0.75 Volts at the end of the write operation, or about 400 mV less than the full $V_{DD}$ supply voltage of 1.15 Volts. Stated another way, the storage node N1 has only reached 60-70% of the desired final voltage during the write cycle. In this case, after the write operation has been completed, it is not possible for the data bit stored on the storage node N1 to be reliably read during any subsequent read cycle. Thus, it is not possible to operate bit cell 101 at a frequency of 800 MHz using a conventional memory system architecture.

It would be desirable to have a method and structure that would allow data to be reliably written to a conventional DRAM bit cell at increased operating frequencies (i.e., reduced memory cycle times).

SUMMARY

Accordingly, the present invention provides a method and apparatus for implementing a multiple memory cycle write operation that prevents write operations from limiting the memory cycle time. An incomplete/partial write operation is initially performed, wherein the internal storage node of the bit cell is not fully charged to the $V_{DD}$ or $V_{SS}$ supply voltage. Soon after the incomplete write operation is completed, one or more additional refresh or write operations are performed during one or more subsequent memory cycles to fully charge the storage node of the bit cell to the full $V_{DD}$ or $V_{SS}$ supply voltage level.

The present invention will be more fully understood in view of the following description and drawings.

DETAILED DESCRIPTION

Figure 1A:
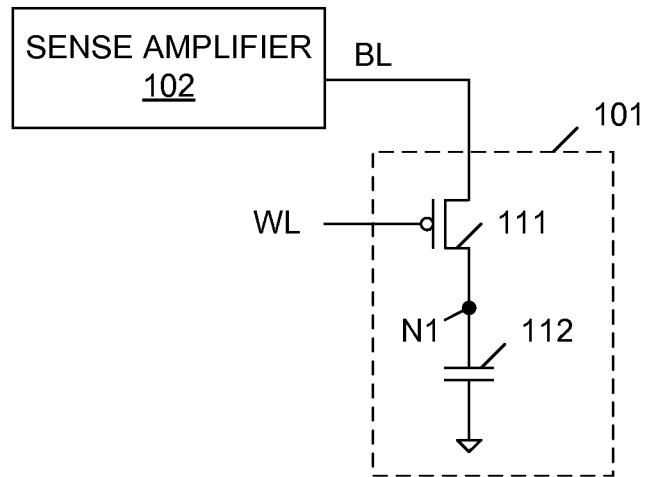
FIG. 1A is a circuit diagram of a conventional dynamic random access memory (DRAM) bit cell.
Figure 1B:
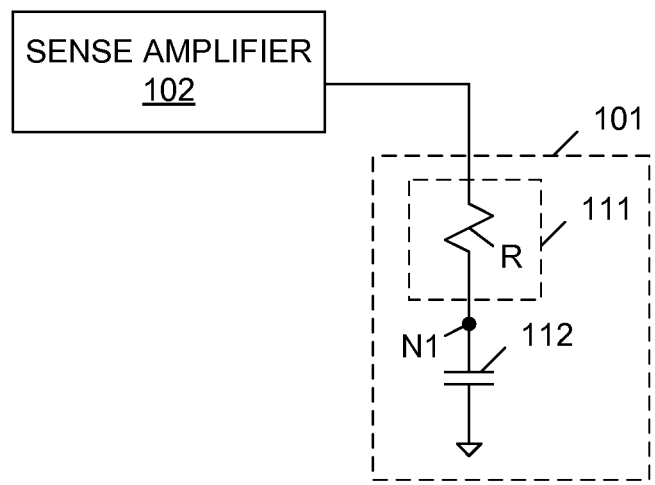
FIG. 1B is a circuit diagram that represents the DRAM bit cell of FIG. 1A during a write operation.
Figure 2A:
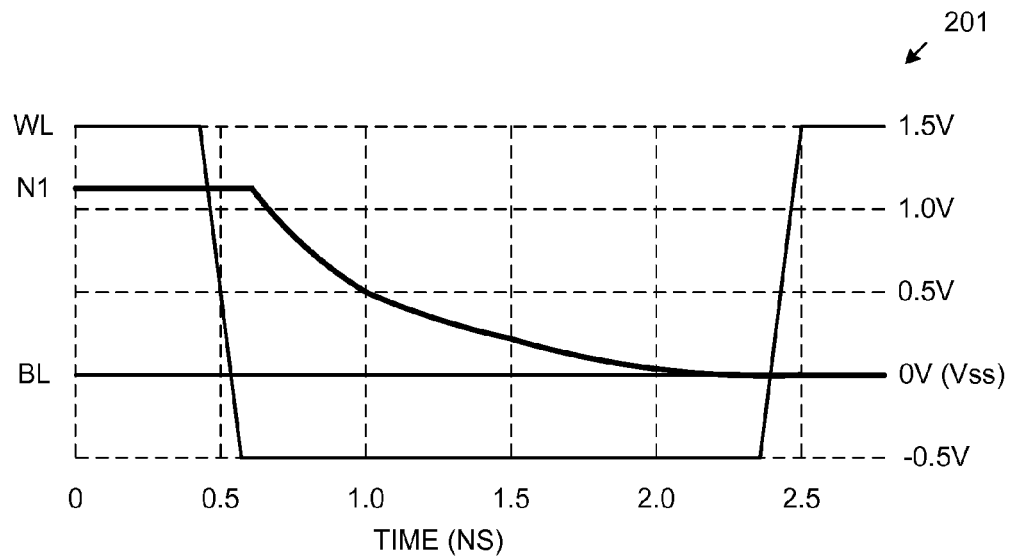
FIGS. 2A and 2B are timing diagrams illustrating the key waveforms for memory array write operations to the DRAM bit cell of FIGS. 1A-1B at a frequency of 400 MHz.
Figure 2B:
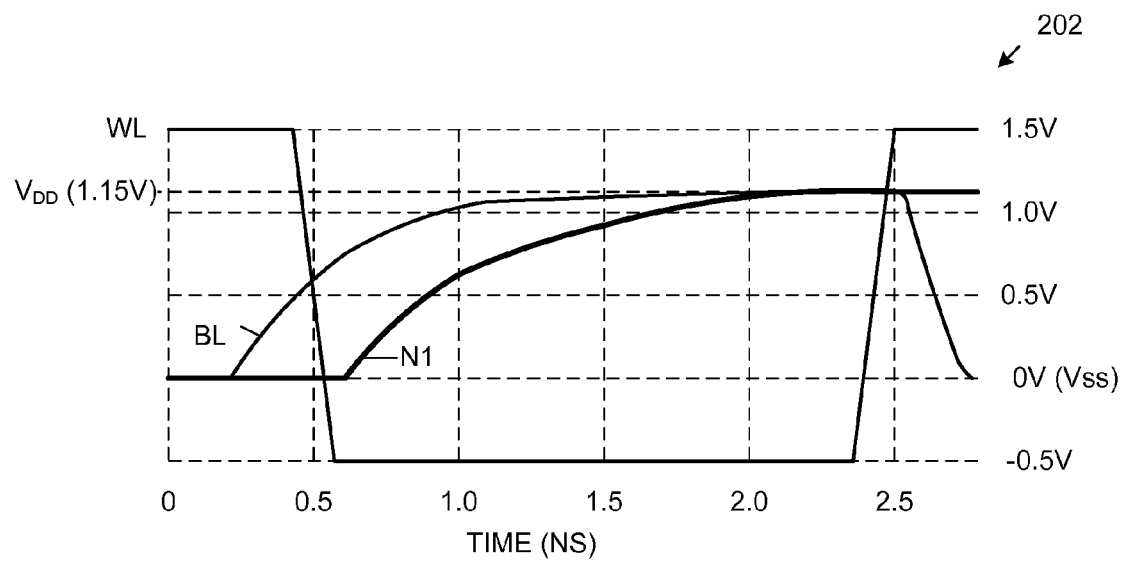
Figure 3A:
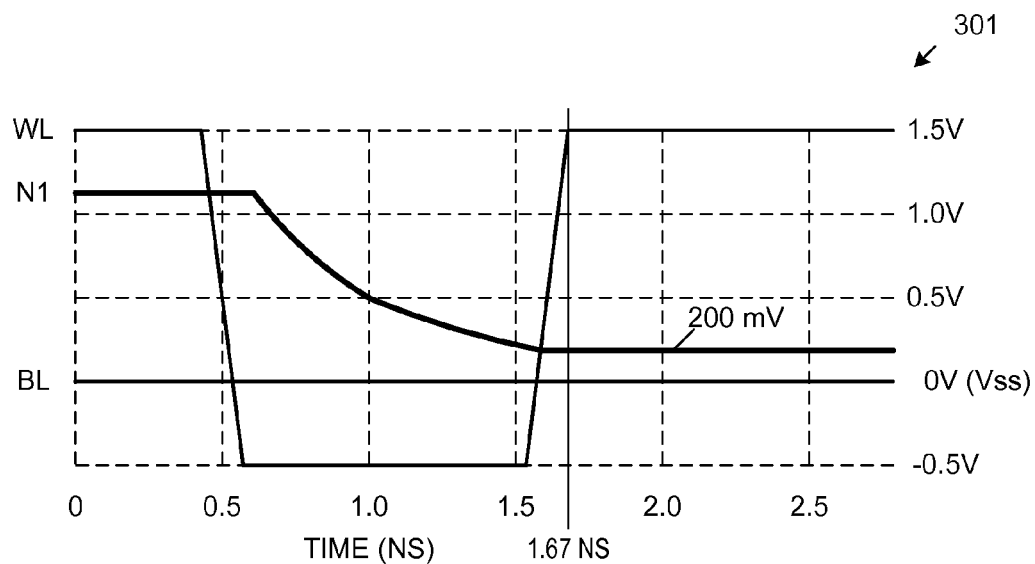
FIGS. 3A and 3B are timing diagrams illustrating the key waveforms for memory array write operations to the DRAM bit cell of FIGS. 1A-1B at a frequency of 600 MHz.
Figure 3B:
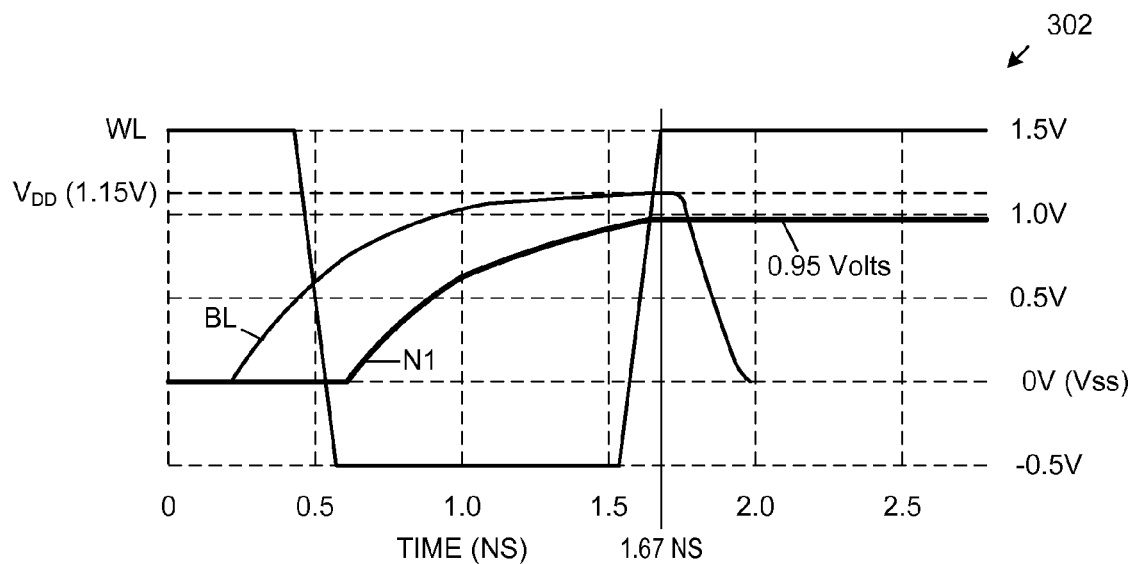

In general, the present invention includes a multi-bank memory system that implements multi-cycle write operations, which effectively allows the memory cycle time of a DRAM memory system to be reduced. To perform a write operation, an incomplete/partial write operation is initially performed to a memory bank. At the end of the incomplete/partial write operation, the charge stored on the storage node of the DRAM bit cell is less than the full desired write voltage (e.g., the $V_{DD}$ or $V_{SS}$ supply voltage). In accordance with a first embodiment of the present invention, the storage node of the DRAM bit cell stores a charge which may be reliably read for up to N cycles after the completion of the incomplete write operation, wherein N is less than the number of cycles in the normal refresh interval. In this embodiment, the voltage on the storage node is pulled at least about 80 to 90% of the way between the supply voltages $V_{DD}$ and $V_{SS}$ during the incomplete/partial write operation. These percentages will vary depending on parameters such as sense amplifier offset. This situation may be represented, for example, by FIGS. 3A-3B. In this embodiment, a refresh operation is performed to the bit cell within N cycles of completing the incomplete write operation. The refresh operation is sufficient to pull the storage node of the bit cell the rest of the way to the desired voltage level (e.g., $V_{DD}$ or $V_{SS}$). In one embodiment, access control logic of the memory system determines whether an idle cycle is available within N cycles of completing the write cycle. If an idle cycle is available, the refresh operation is performed during the idle cycle. If no idle cycles are available within N cycles of completing the incomplete write operation, the access control logic may force an idle cycle, such that the refresh operation can be performed during this forced idle cycle.

In one variation, multiple refresh operations may be required to pull the storage node of the bit cell to the full supply voltage of $V_{DD}$ or $V_{SS}$. In this case, the access control logic is modified to ensure that the proper number of refresh operations are performed within the required time period (N cycles).

Figure 4A:
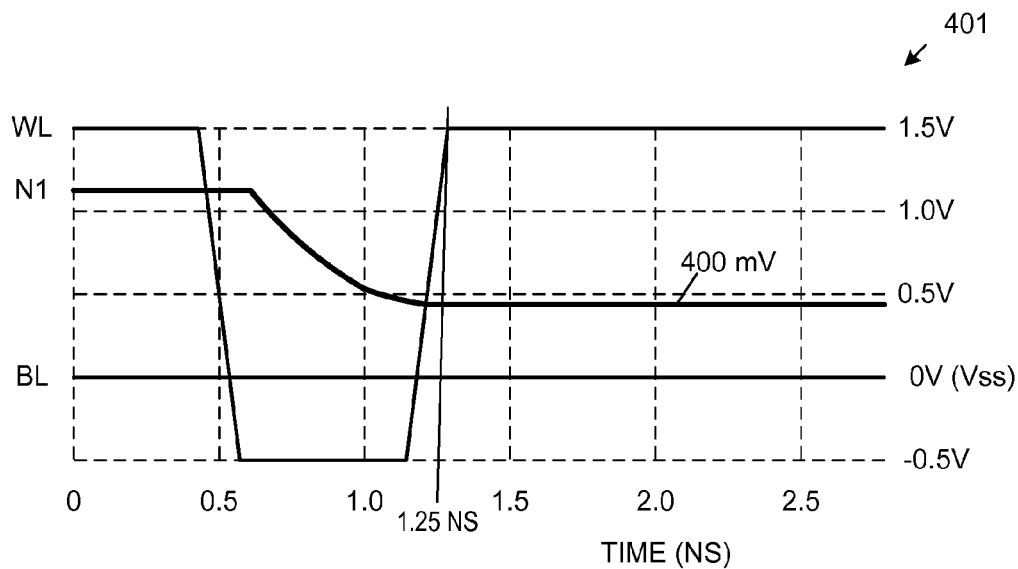
FIGS. 4A and 4B are timing diagrams illustrating the key waveforms for memory array write operations to the DRAM bit cell of FIGS. 1A-1B at a frequency of 800 MHz.
Figure 4B:
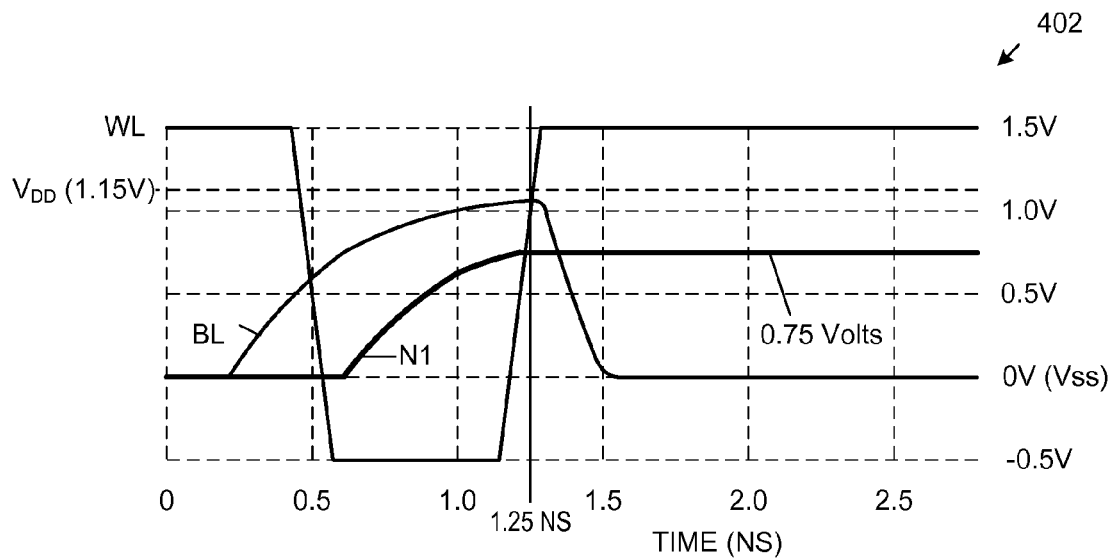

In accordance with a second embodiment of the present invention, the storage node of the bit cell stores a charge which may not be reliably read at the end of the incomplete/partial write operation. This situation may be represented, for example, by FIGS. 4A-4B. In order to pull the storage node of the bit cell to the full supply voltage (i.e., $V_{DD}$ or $V_{SS}$), one or more supplemental write operations are subsequently performed to the DRAM bit cell. In this embodiment, a write cache is used to store the write data value between the initial incomplete/partial write operation and the subsequent supplemental write operation(s). If only one supplemental write operation is required to pull the storage node of the bit cell to the full supply voltage of $V_{DD}$ or $V_{SS}$, the write cache may have a capacity corresponding with the capacity of one memory bank. If a plurality of X supplemental write operations are required to pull the storage node of the bit cell to the full supply voltage of $V_{DD}$ or $V_{SS}$, the write cache may have a capacity corresponding with the capacity of X memory banks.

The present invention will now be described in more detail.

Figure 5:
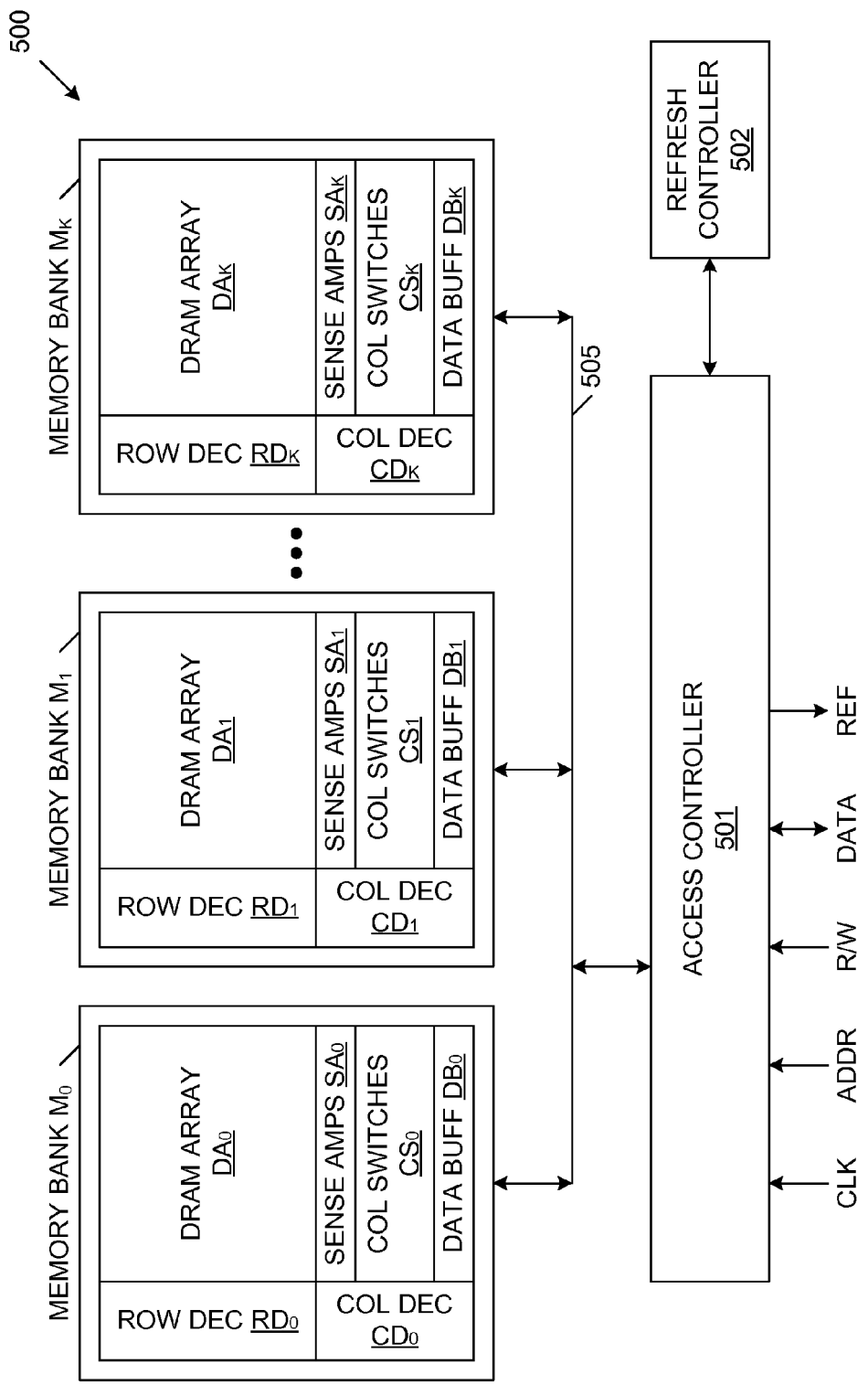
FIG. 5 is a block diagram of a multi-bank memory system in accordance with one embodiment of the present invention.

FIG. 5 is a block diagram of a multi-bank memory system 500 in accordance with the first embodiment of the present invention. Memory system 500 includes access controller 501, refresh controller 502, parallel bus structure 505, and a plurality of memory banks $M_0$-$M_K$. Memory banks $M_0$-$M_K$ include DRAM bit cell arrays $DA_0$-$DA_K$, respectively, row decoders $RD_0$-$RD_K$, respectively, column decoders $CD_0$-$CD_K$, respectively, sense amplifier circuits $SA_0$-$SA_K$, respectively, column switches $CS_0$-$CS_K$, respectively, and data buffers $DB_0$-$DB_K$, respectively. In one embodiment, multi-bank memory system 500 may include 256 memory banks, each having 64 rows and 512 columns of bit cells (and a 32-bit word width). In general, access controller 501 implements read and write operations to memory banks $M_0$-$M_K$ in response to a clock signal CLK, a read/write control signal R/W, address signals ADDR and data signals DATA, which are provided by an accessing device. Access controller 501 may implement a read or write operation to any one of memory banks $M_0$-$M_K$ during any given cycle of the CLK signal. Memory banks that are not being read or written during a particular cycle are said to be idle (or in an idle cycle). Memory banks in an idle cycle may be refreshed by refresh controller 502, if necessary. In one embodiment, refresh controller 502 operates in a conventional manner to ensure that each row of each of the memory banks $M_0$-$M_K$ is refreshed during a normal refresh period, which can be, for example, 1 millisecond or 400,000 cycles of a 400 MHz clock signal.

Each of memory banks $M_0$-$M_K$ is accessed in page mode. Thus, during a read access of memory bank $M_X$, the corresponding row decoder $RD_X$ activates a word line associated with the row $R_A$ to be read. The corresponding column decoder $CD_X$ activates the associated sense amplifiers $SA_X$, such that the contents of the entire row $R_A$ are stored in these sense amplifiers. The column decoder $CD_X$ also enables a subset of the column switches $CS_X$, thereby selectively coupling a subset of the sense amplifiers $SA_X$ to data buffer $DB_X$, which drives the read data value onto the parallel bus structure 505 (and to access controller 501). When a read operation is performed to a row $R_A$ of memory bank $M_X$, the voltages developed by the associated sense amplifiers $SA_X$ effectively refresh all of the data stored by the row $R_A$.

Refresh operations are performed on a per row basis, wherein the contents of an entire row $R_A$ of memory bank $M_X$ are read and stored in the corresponding set of sense amplifiers $SA_X$. Note that the column switches $CS_X$ of the memory bank $M_X$ are not activated during a refresh operation, such that the sense amplifiers $SA_X$ are isolated from the data buffer $DB_X$ and the parallel bus structure 505 during a refresh operation. A refresh operation may therefore be considered to be a read operation without column access.

A write operation to word $W_A$ in row $R_A$ of memory bank $M_X$ is performed by driving the write data from the access controller 501 onto the parallel bus structure 505, and into data buffer $DB_X$. The corresponding row decoder $RD_X$ activates the word line associated with the row $R_A$ to be written, and the corresponding column decoder $CD_X$ activates the sense amplifiers $SA_X$, such that the contents of the entire row $R_A$ are stored in these sense amplifiers $SA_X$. The column decoder $CD_X$ also enables a subset of the column switches $CS_X$ associated with the word location to be written, thereby selectively coupling a subset of the sense amplifiers $SA_X$ to the data buffer $DB_X$. The write data stored in the data buffer $DB_X$ overwrites the data in the subset of sense amplifiers $SA_X$. This subset of sense amplifiers $SA_X$, in turn, drives the write data into the corresponding bit cells in the addressed row. Note that the non-written bit cells of the row $R_A$ are effectively refreshed during the write operation.

In accordance with a first embodiment of the present invention, access controller 501 performs multiple-cycle write operations in the following manner. An external device provides a read/write control signal R/W that indicates that a write operation should be performed, an address value ADDR that identifies the address (bank, row and word) of the write operation, and the write data value DATA to be written. In response, access controller 501 initially performs an incomplete/partial write operation to the addressed row/word of the addressed bank. At the end of the incomplete/partial write operation, the charges stored on the storage nodes of the addressed bit cells are less than the full desired write voltages (e.g., the $V_{DD}$ and $V_{SS}$ supply voltages). The storage nodes of the addressed bit cells store charges which may be reliably read for up to N cycles after the completion of the incomplete/partial write operation, wherein N is less than the number of cycles in the normal refresh interval. If each bank has 1024 words, then N will be significantly greater than 1024, but less than the number of cycles in a refresh interval. For example, N may range between 3,000 and 4,000. Preferably N will be between 1 and 2% of the number of cycles in a normal refresh interval. In one embodiment, a normal refresh interval may be equal to 400,000 cycles. The incomplete/partial write operation of this embodiment may be represented by the waveform diagrams 301 and 302 of FIGS. 3A and 3B.

Figure 6:
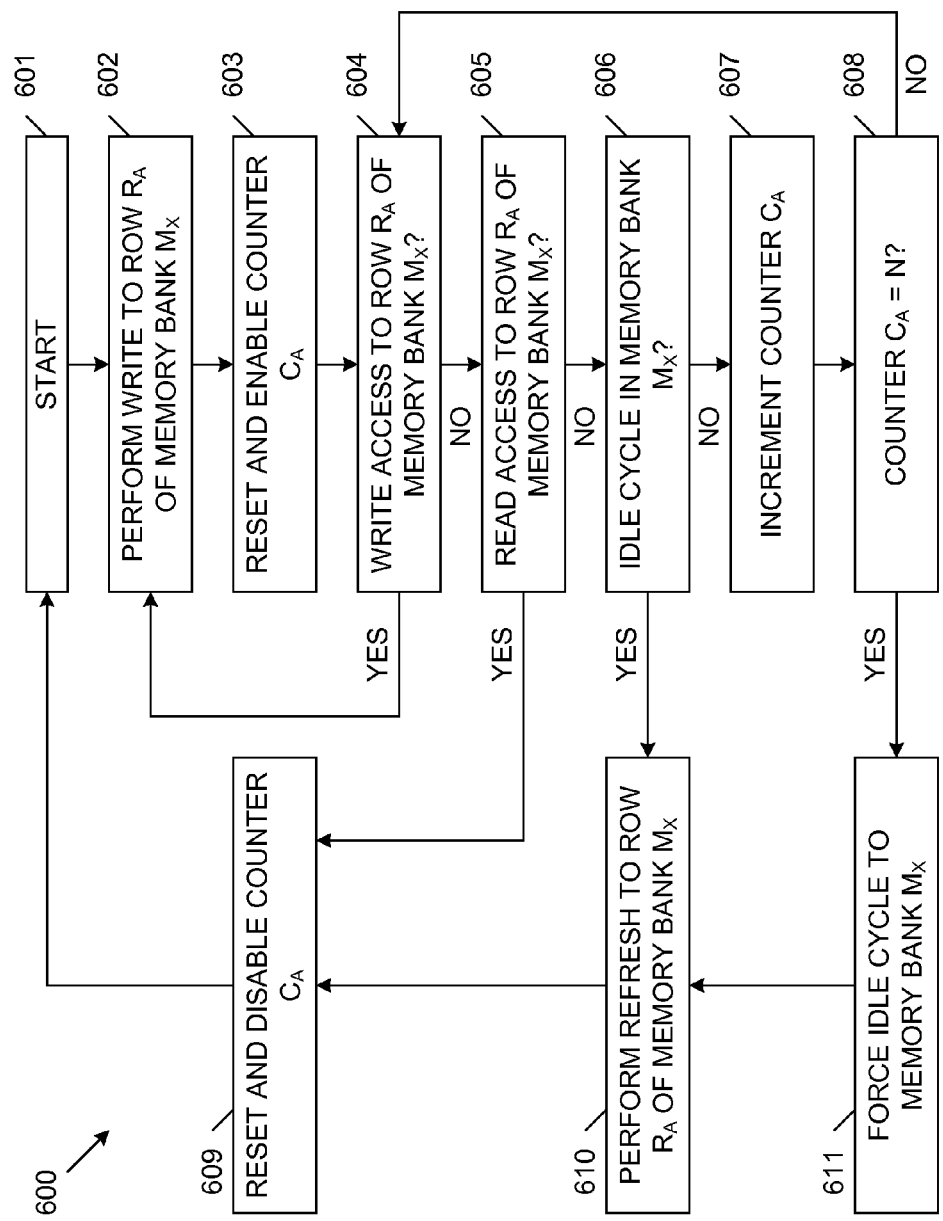
FIG. 6 is a flow diagram that defines a two-cycle write process implemented by the multi-bank memory system of FIG. 5, in accordance with one embodiment of the invention.

FIG. 6 is a flow diagram 600 that defines the multi-cycle write process implemented by access controller 501 to perform write operations to row $R_A$ of memory bank $M_X$, in accordance with one embodiment of the invention. At the start of the write process (Step 601), a write command specifying a write operation to row $R_A$ of memory bank $M_X$ is detected. An incomplete/partial write operation is performed to row $R_A$ of memory bank $M_X$ (Step 602), and a counter/timer $C_A$ associated with row $R_A$ is reset and enabled (Step 603). During the next cycle, access controller 501 determines whether there is a subsequent write access to row $R_A$ of memory bank $M_X$ (Step 604). If so (Step 604, YES branch), then processing returns to step 602, wherein a write operation is performed to row $R_A$ of memory bank $M_X$, and the counter $C_A$ is reset and enabled (Step 603). Note that the subsequent write operation to row $R_A$ of memory bank $M_X$ either: (a) overwrites the same word location as the initial write operation to row $R_A$ of memory bank $M_X$, or (b) writes to a new word location of row $R_A$ of memory bank $M_X$. In situation (a), it is no longer necessary to refresh the initially written data, as this data has been overwritten with new data. Similarly, in situation (b), it is no longer necessary to refresh the initially written data, because this data is refreshed by the write operation performed to the new word location of row $R_A$ of memory bank $M_X$. In both situations (a) and (b), it becomes necessary to refresh the newly written data (and so the counter $C_A$ is reset and enabled in Step 603).

If access controller 501 determines that a write access to row $R_A$ of memory bank $M_X$ is not performed during the next cycle (Step 604, NO branch), processing proceeds to Step 605, wherein access controller 501 determines whether or not a read access is performed to row $R_A$ of memory bank $M_X$ during the cycle. If so (Step 605, YES branch), the read access causes all of the memory cells of row $R_A$ of memory bank $M_X$ to be refreshed. As a result, the previously incomplete write operation to row $R_A$ of memory bank $M_X$ is completed by the read access. Access controller 501 then resets and disables the counter $C_A$ (Step 609), and processing returns to Step 601.

If access controller 501 determines that no read access is performed to row $R_A$ of memory bank $M_X$ during the cycle (Step 605, NO branch), processing proceeds to Step 606, wherein access controller 501 determines whether an idle cycle exists in memory bank $M_X$. Access controller 501 will determine that an idle cycle exists in memory bank $M_X$ if there are no access requests to memory system 500, or there is a read or write access request to one of the memory banks other than memory bank $M_X$.

If access controller 501 determines that an idle cycle exists in memory bank $M_X$ (Step 606, YES branch), then access controller 501 performs a refresh operation to row $R_A$ of memory bank $M_X$ (Step 610). As a result, the previously incomplete write operation to row $R_A$ of memory bank $M_X$ is completed by the refresh operation. Access controller 501 then resets and disables counter $C_A$ (Step 609), and processing returns to Step 601.

In accordance with one variation, access controller 501 may arbitrate between completing the incomplete write operation by refreshing row $R_A$ of memory bank $M_X$, or performing a refresh operation to another row $R_B$ of memory bank $M_X$ specified by refresh controller 502, during an idle cycle.

If access controller 501 determines that an idle cycle does not exist in memory bank $M_X$ (Step 606, NO branch), then the present cycle must include an access request to a row $R_B$ within memory bank $M_X$, other than row $R_A$. Under these conditions, the requested access to the other row $R_B$ within memory bank $M_X$ is performed, such that the incomplete/partial write operation within row $R_A$ of memory bank $M_X$ cannot be completed during the present cycle. (Note that if the access request to row $R_B$ of memory bank $M_X$ is a write request, access controller 501 will reset and enable a counter $C_B$ associated with this row $R_B$.)

Processing then proceeds to Step 607, wherein the value stored by counter $C_A$ is incremented. The value stored by counter $C_A$ represents the number of cycles that an incomplete/partial write operation has been pending within row $R_A$ of memory block $M_X$. Processing proceeds from Step 607 to Step 608, wherein access controller 501 determines whether the value stored by counter $C_A$ has reached a value of N. Note that N is selected to be less than or equal to the number of cycles that the incomplete write data may be reliably read from row $R_A$ of memory bank $M_X$.

If the value stored by counter $C_A$ has not yet reached a value of N (Step 608, NO branch), processing returns to Step 604, such that the incomplete write operation to row $R_A$ of memory bank $M_X$ has another chance to be completed during the next cycle.

If the value stored by counter $C_A$ has reached a value of N (Step 608, YES branch), access controller 501 forces an idle cycle within memory system 500 (Step 611). In one embodiment, access controller 501 may force the idle cycle by activating a refresh signal REF, which is provided to the external accessing device. During the forced idle cycle, access controller 501 performs a refresh operation to row $R_A$ of memory bank $M_X$ (Step 610), thereby completing the incomplete/partial write operation within row $R_A$ of memory bank $M_X$. Access controller 501 then resets and disables counter $C_A$ (Step 609), and processing returns to Step 601.

Although FIG. 6 illustrates the operation of a counter $C_A$ associated with one row $R_A$ of memory bank $M_X$, it is understood that access controller 501 simultaneously maintains similar counters for the other rows of memory bank $M_X$, as necessary. For example, if a write operation is performed to row $R_A$ of memory bank $M_X$ during a first cycle, access controller 501 will control the associated counter $C_A$ in the manner described above. If a second write operation is performed to a different row $R_B$ of memory bank $M_X$ during a subsequent cycle, then access controller 501 will control a corresponding counter $C_B$ associated with this row $R_B$ in the same manner illustrated by FIG. 6.

When an incomplete/partial write operation is subsequently completed by a read, write, or refresh operation in the manner described above, the storage nodes of the associated bit cells are pulled to the full supply voltages (e.g., $V_{DD}$ or $V_{SS}$). At this time, the refresh of these bit cells is controlled by refresh controller 502 in a manner known to those of ordinary skill in the art.

Figure 7:
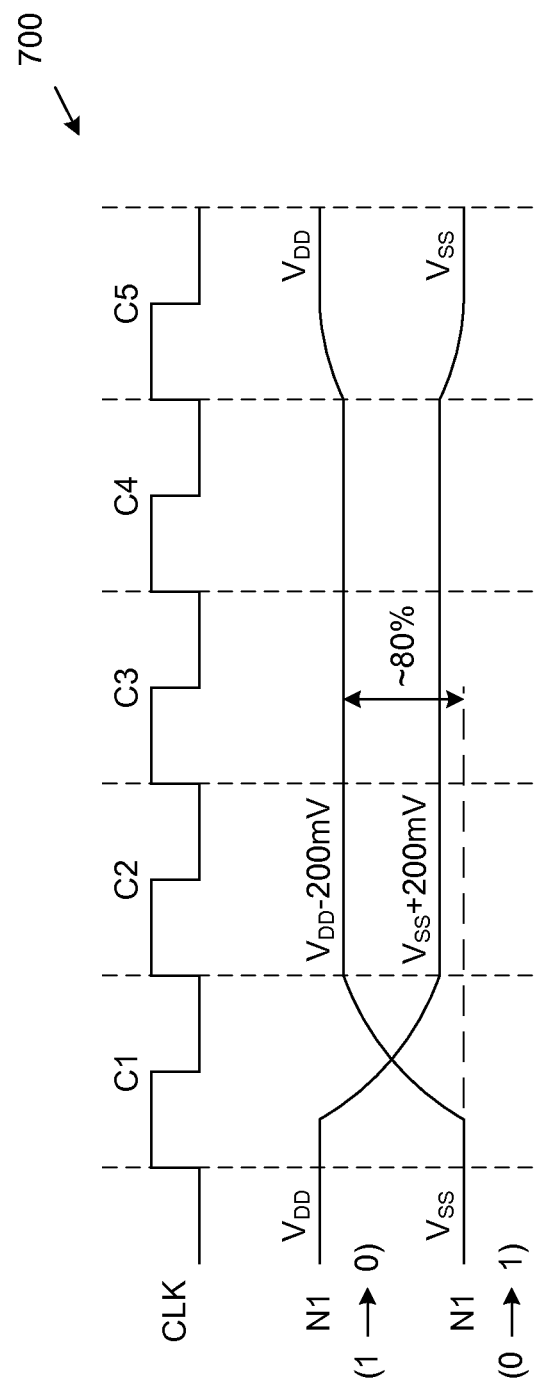
FIG. 7 is a waveform diagram illustrating storage node voltages associated with an incomplete/partial write operation that is performed during a first cycle, but is not completed until a subsequent cycle, cycle 5 in the example, in accordance with one embodiment of the invention.

FIG. 7 is a waveform diagram 700 illustrating the storage node voltages associated with an incomplete/partial write operation that is performed during a first cycle C1, but is not completed until a subsequent cycle C5, due to intervening accesses to different columns of the same memory bank during cycles C2-C4.

Thus, when the storage node N1 initially stores a logic "1" data bit, and a logic "0" data bit is then written to the storage node N1 (i.e., N1 (1→0)), the voltage on the storage node N1 is initially pulled down from the $V_{DD}$ supply voltage to $V_{SS}$+200 mV during cycle C1 (i.e., about 80% of the way from the $V_{DD}$ supply voltage to the $V_{SS}$ supply voltage), and is then pulled down from $V_{SS}$+200 mV to the $V_{SS}$ supply voltage during cycle C5. Similarly, when the storage node N1 initially stores a logic "0" data bit, and a logic "1" data bit is then written to the storage node N1 (i.e., N1 (0→1)), the voltage on the storage node N1 is initially pulled up from the $V_{SS}$ supply voltage to $V_{DD}$-200 mV during cycle C1 (i.e., about 80% of the way from the $V_{SS}$ supply voltage to the $V_{DD}$ supply voltage), and is then pulled up from $V_{DD}$-200 mV to the $V_{DD}$ supply voltage during cycle C5.

In one variation, more than one refresh operation (e.g., Y refresh operations) may be required to pull the storage nodes of the bit cells to the full supply voltages ($V_{DD}$ and $V_{SS}$). In this case, the access controller 501 is modified to ensure that each word written to memory bank $M_X$ is refreshed Y times within N cycles of writing the word.

Figure 8:
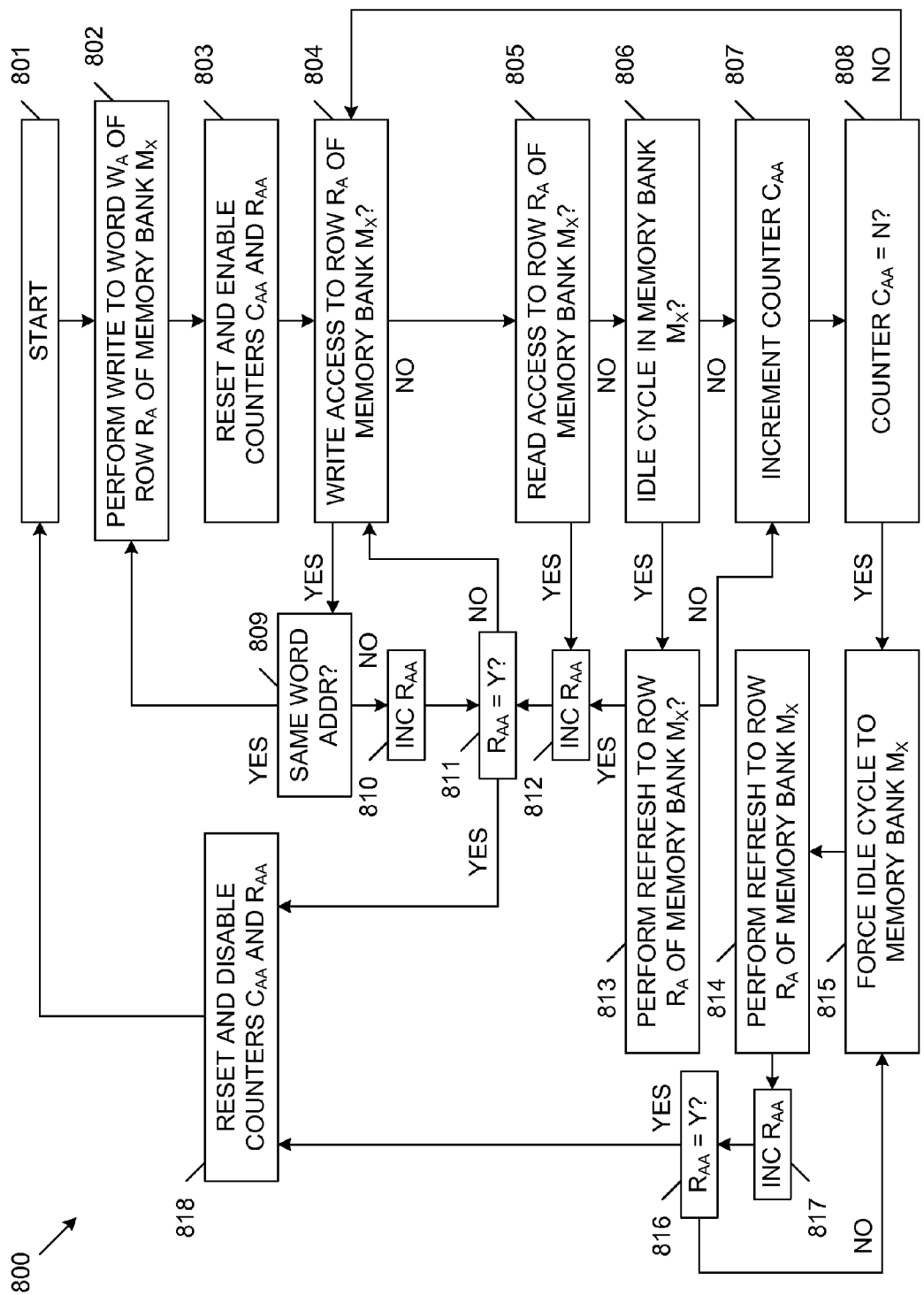
FIG. 8 is a flow diagram that defines an N-cycle write process implemented by the multi-bank memory system of FIG. 5, in accordance with one embodiment of the invention.

FIG. 8 is a flow diagram 800 illustrating one manner in which access controller 501 may operate to ensure that each word written to memory bank $M_X$ is refreshed Y times within N cycles of writing the word. At the start of the write process (Step 801), a write command specifying a write operation to word address $W_A$ of row $R_A$ of memory bank $M_X$ is detected. A write operation is performed to word address $W_A$ of row $R_A$ of memory bank $M_X$ (Step 802), and a pair of counters $C_{AA}$ and $R_{AA}$ associated with word address $W_A$ of row $R_A$ of memory bank $M_X$ are reset and enabled (Step 803). In general, counter $C_{AA}$ operates in a manner similar to counter $C_A$ (FIG. 6), and is capable of counting up to N cycles. As described in more detail below, counter $R_{AA}$ keeps track of the number of refresh operations performed to the bit cells associated with word address $W_A$ of row $R_A$ of memory bank $M_X$ after an original data value is written to this location.

During the next access cycle, access controller 501 determines whether there is a subsequent write access to row $R_A$ of memory bank $M_X$ (Step 804). If so (Step 804, YES branch), then access controller 501 determines whether this subsequent write access will overwrite the same word address $W_A$ as the original write access (Step 809). If the subsequent write access addresses the same word location $W_A$ as the original write access (Step 809, YES branch), then processing returns to Step 802, wherein the original write data is overwritten with new write data (Step 802) and the counters $C_{AA}$ and $R_{AA}$ are reset (Step 803). This effectively restarts the process for the newly written data.

However, if the subsequent write access addresses a different word address (e.g., word address $W_B$) within row $R_A$ of memory bank $M_X$ (Step 809, NO branch), then access controller 501 performs a write operation to this different word address $W_B$ within row $R_A$ of memory bank M. As described above, this write operation refreshes the data initially written to word address $W_A$ of row $R_A$ of memory bank M. Access controller 501 increments the counter $R_{AA}$ (Step 810) to reflect the fact that word address $W_A$ of row $R_A$ of memory bank $M_X$ has been refreshed. Processing then proceeds to Step 811, wherein access controller 501 determines whether the required number of refresh operations have been performed. More specifically, if the value stored by counter $R_{AA}$ has reached a value of Y (Step 811, YES branch), indicating that all necessary refresh operations have been performed to word address $W_A$ of row $R_A$ of memory bank $M_X$, then access controller 501 resets and disables counters $C_{AA}$ and $R_{AA}$, (Step 818) and processing returns to Step 801.

If the value stored by counter $R_{AA}$ has not reached a value of Y (Step 811, NO branch), indicating that not all necessary refresh operations have been performed, then processing returns to Step 804.

Within Step 804, if access controller 501 determines that a write access to row $R_A$ of memory bank $M_X$ is not performed during the present access cycle (Step 804, NO branch), processing proceeds to Step 805, wherein access controller 501 determines whether or not a read access is performed to row $R_A$ of memory bank $M_X$ during the cycle. If so (Step 805, YES branch), the read access causes all of the memory cells of row $R_A$ of memory bank $M_X$ to be refreshed. In response, access controller 501 increments the counter $R_{AA}$ (Step 812) to reflect the fact that word address $W_A$ of row $R_A$ of memory bank $M_X$ has been refreshed. Processing then proceeds to Step 811, wherein access controller 501 determines whether the required number of refresh operations have been performed. If so (Step 811, YES branch), processing proceeds to Steps 818 and 801 in the manner described above. If not (Step 811, NO branch), processing returns to Step 804.

If access controller 501 determines that no read access is performed to row $R_A$ of memory bank $M_X$ during the present cycle (Step 805, NO branch), processing proceeds to Step 806, wherein access controller 501 determines whether an idle cycle exists in memory bank $M_X$ during the present cycle. If access controller 501 determines that an idle cycle exists in memory bank $M_X$ (Step 806, YES branch), then access controller 501 may perform a refresh operation to row $R_A$ of memory bank $M_X$ (Step 813, YES branch). In this case, access controller 501 increments the counter $R_{AA}$ (Step 812) to reflect the fact that this refresh operation has been performed. Processing then proceeds to Step 811, wherein access controller 501 determines whether the required number of refresh operations have been performed. If so (Step 811, YES branch), processing proceeds to Steps 818 and 801 in the manner described above. If not (Step 811, NO branch), processing returns to Step 804.

Note that it is possible that access controller 501 may actually perform a refresh operation to a row other than row $R_A$ during the idle cycle in memory bank $M_X$ (Step 813, NO branch). This may occur, for example, if another row in memory bank $M_X$ has a higher refresh priority. In this case, processing proceeds to Step 807 (i.e., counter $R_{AA}$ is not incremented because row $R_A$ was not refreshed).

If access controller 501 determines that an idle cycle does not exist in memory bank $M_X$ (Step 806, NO branch), then the present cycle must include an access request to a row $R_B$ within memory bank $M_X$, other than row $R_A$. Under these conditions, the requested access to the other row $R_B$ within memory bank $M_X$ is performed, such that the incomplete write operation within word address $W_A$ of row $R_A$ of memory bank $M_X$ cannot be completed during the present cycle. (Note that if the access request to row $R_B$ of memory bank $M_X$ is a write request to a word address $W_B$, access controller 501 will reset and enable counters $C_{BB}$ and $R_{BB}$ associated with the word address $W_B$ of row $R_B$ of memory bank $M_X$.)

Processing then proceeds to Step 808, wherein the value stored by counter $C_{AA}$ is incremented. The value stored by counter $C_{AA}$ represents the number of cycles that an incomplete/partial write operation has been pending within the word location $W_A$ of row $R_A$ of memory block $M_X$. Processing proceeds from Step 807 to Step 808, wherein access controller 501 determines whether the value stored by counter $C_{AA}$ has reached a value of N. In one embodiment, N is selected to be less than or equal to the number of cycles that the incomplete write data may be reliably read from word address $W_A$ of row $R_A$ of memory bank $M_X$.

If the value stored by counter $C_{AA}$ has not yet reached a value of N (Step 808, NO branch), processing returns to Step 804, such that the incomplete write operation to word address $W_A$ of row $R_A$ of memory bank $M_X$ has another chance to be completed during the next access cycle.

If the value stored by counter $C_{AA}$ has reached a value of N (Step 808, YES branch), access controller 501 forces an idle cycle within memory system 500 (Step 815). During the forced idle cycle, access controller 501 performs a refresh operation to row $R_A$ of memory bank $M_X$ (Step 814). Access controller 501 then increments the counter $R_{AA}$ (Step 817) and determines whether the required number of refresh operations have been performed (Step 816). If so (Step 816, YES branch), processing proceeds to Steps 818 and 801 in the manner described above. If not (Step 816, NO branch), processing returns to Step 815, wherein access controller 501 forces another idle cycle to memory bank $M_X$. During the forced idle cycle, access controller 501 performs another refresh operation to row $R_A$ of memory bank $M_X$ (Step 814). Access controller 501 again increments the counter $R_{AA}$ (Step 817) and again determines whether the required number of refresh operations have been performed (Step 816). This process repeats until the required number of refresh operations have been performed (Step 816, YES branch). Processing then proceeds to Steps 818 and 801 in the manner described above.

Although FIG. 8 illustrates the operation of a counters $C_{AA}$ and $R_{AA}$ associated with one word address $W_A$ of one row $R_A$ of memory bank $M_X$, it is understood that access controller 501 may simultaneously maintain similar counters for the other word addresses of memory bank $M_X$, as necessary.

In accordance with a second embodiment of the present invention, access controller 501 performs multiple-cycle write operations in the following manner. Access controller 501 initially performs an incomplete/partial write operation to the addressed row/word of the addressed bank. At the end of the incomplete/partial write operation, the charges stored on the storage nodes of the addressed bit cells are so far from the full desired write voltages (e.g., the $V_{DD}$ and $V_{SS}$ supply voltages) that these bit cells may not be reliably read, even during the cycle immediately following the incomplete/partial write operation. The incomplete/partial write operation of this embodiment may be represented by the waveform diagrams 401 and 402 of FIGS. 4A and 4B.

The incomplete/partial write operation of the second embodiment is completed by performing one or more supplemental write operations to the same address. These supplemental write operations drive the voltages on the storage nodes toward the full supply voltages ($V_{DD}$ and $V_{SS}$).

Note that when a bit cell is incompletely/partially written, the data in this bit cell is not yet recognized as being valid. The present invention uses an SRAM cache (also known as a write cache) in combination with an access controller to prevent direct reads to a bit cell before the associated storage node has been driven to a full supply voltage. The data for the bit cell is stored and retrieved from the cache until the multi-cycle write operation on the bit cell has been completed. For a two cycle write operation, the size of the SRAM cache must be equal to the size of memory bank $M_X$. For a "Z" cycle write operation, the size of the SRAM cache must be equal to "Z−1" times the size of memory bank $M_X$.

Note that the memory cycle time of the second embodiment can generally be shorter than the memory cycle time of the first embodiment, because the incomplete/partial write operation of the second embodiment requires a smaller voltage swing on the storage node.

Figure 9:
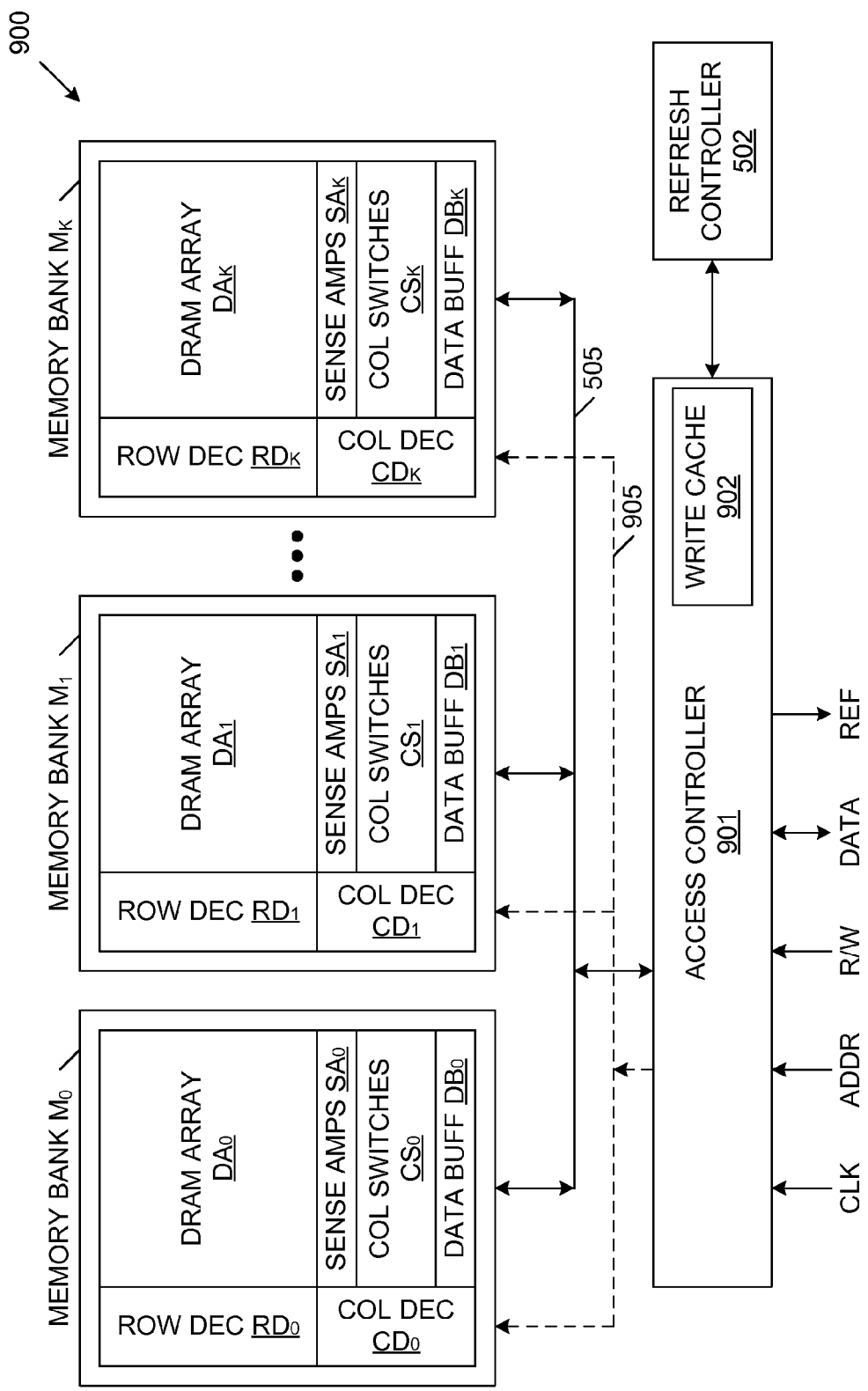
FIG. 9 is a block diagram of a multi-bank memory system that includes a write cache in accordance with a second embodiment of the present invention.

FIG. 9 is a block diagram of a multi-bank memory system 900 in accordance with the second embodiment of the present invention. Because memory system 900 is similar to memory system 500, similar elements in FIGS. 9 and 5 are labeled with similar reference numbers. Memory system 900 includes an access controller 901 that includes a write cache 902. In the present example, write cache 902 has the same capacity as one of the memory banks $M_0$-$M_K$, thereby providing for a multi-cycle write operation having two write cycles. Memory system 900 also includes a write-only parallel bus structure 905, which enables write operations to memory banks $M_0$-$M_K$. Write operations can be performed on bus structure 905 in parallel with read/write operations performed on bus structure 505. For example, a read (or write) operation may be performed to memory bank $M_0$ on bus structure 505 at the same time that a write operation is performed to memory bank $M_K$ on bus structure 905. This general architecture is described in more detail in commonly owned U.S. Pat. No. 6,449,685, which is hereby incorporated by reference.

During an initial write operation, a write data value $D_A$ is (partially) written to a word address $W_A$ of a row address $R_A$ of memory bank $M_A$. In parallel, the write data value $D_A$ is also written to word address $W_A$ of row address $R_A$ of write cache 902. This location of the write cache 902 is also written to store the bank address $M_A$ associated with the write operation. A valid bit associated with this location of the write cache 902 is also activated to indicate that the second cycle of the associated write operation is pending and not yet completed.

If the next memory cycle represents an idle cycle within memory bank $M_A$, then the access controller 901 completes the pending write operation (i.e., performs the second write cycle) on bus structure. That is, access controller 901 causes the write data value $D_A$ and memory bank address $M_A$ to be retrieved from word address $W_A$/row address $R_A$ of write cache 902, and then causes this write data value $D_A$ to be written to word address $W_A$/row address $R_A$ of memory bank $M_A$ on bus structure 905. Upon completion of this write operation, access controller 901 de-activates the valid bit associated with word address $W_A$/row address $R_A$ of write cache 902, because the write operation of write data value $D_A$ has been completed. Note that an idle cycle will exist within memory bank $M_A$ if: (a) there is no external access to memory system 900, (b) there is a write access to a memory bank other than memory bank $M_A$, (c) there is a read access to a memory bank other than memory bank $M_A$, or (d) there is a read access to word address $W_A$/row address $R_A$ of memory bank $M_A$. As described in more detail below, memory bank $M_A$ experiences an idle cycle in situation (d) because the read access is performed by accessing the write cache 902.

For each new write operation, access controller 901 determines whether the new write operation hits write cache 902. For example, assume that a new write operation specifies that the write data value $D_B$ is to be written to a word address $W_B$ of a row address $R_B$ of memory bank $M_B$. Access controller 901 uses the word address $W_B$ and the row address $R_B$ of the current write operation to retrieve the valid bit associated with this row/word address from write cache 902. If this retrieved valid bit is not activated, a cache miss exists. In this case, the write data value $D_B$ associated with the new write operation is (partially) written to the word address $W_B$/row address $R_B$ of the addressed memory bank $M_B$ on bus structure 505. The write data value $D_B$ is also written to the word address $W_B$/row address $R_B$ of write cache 902. Word address $W_B$/row address $R_B$ of write cache 902 is also modified to store the address associated with the memory bank $M_B$, and to activate the associated valid bit. Note that access controller 901 may also complete a pending write operation (i.e., perform the second write cycle) on bus structure 905 to a memory bank other than memory bank $M_B$ during this cycle. For example, if memory bank $M_B$ is not the same as memory bank $M_A$ ($M_A \neq M_B$), then access controller 901 may cause the write data value $D_A$ and memory bank address $M_A$ to be retrieved from word address $W_A$/row address $R_A$ of write cache 902, and then cause this write data value $D_A$ to be written to word address $W_A$/row address $R_A$ of memory bank $M_A$ on bus structure 905. In this case, the valid bit associated with word address $W_A$/row address $R_A$ of write cache 902 is de-activated, because the write operation of write data value $D_A$ has been completed.

If the valid bit associated with word address $W_B$/row address $R_B$ of write cache 902 is activated, a cache hit exists. Suppose that the contents of the word address $W_B$/row address $R_B$ of write cache 902 includes an activated valid bit, the bank address $M_A$, and the write data value $D_A$. Access controller 901 compares the bank address $M_A$ retrieved from the write cache 902 with the bank address $M_B$ of the current write operation to determine whether a match exists. If a bank match exists ($M_A = M_B$), the current write data value $W_B$ is written to the word address $W_B$/row address $R_B$ of the memory bank $M_B$/$M_A$ on bus structure 505. The current write data value $W_B$ is also written to the word address $W_B$/row address $R_B$ of write cache 902. In this manner, the current write data value $W_B$ replaces (overwrites) the write data value $W_A$ previously written to the same location.

If a bank match does not exist ($M_A \neq M_B$), access controller 901 performs a (second) write operation of the data value $D_A$ to word address $W_B$/row address $R_B$ of memory bank $M_A$ on bus structure 905, thereby completing the write operation of the write data value $D_A$. During the same cycle, access controller 901 (partially) writes the current write data value $D_B$ to word address $W_B$/row address $R_B$ of the addressed memory bank $M_B$ on bus structure 505. The write data value $D_B$ is also written to the word address $W_B$/row address $R_B$ of write cache 902. This location of the write cache 902 is also modified to store the address associated with the memory bank $M_B$ (and the associated valid bit remains activated).

Under worst case conditions, write operations will be performed to each of the word/row addresses, such that write cache 902 is filled with write data values, and each of the corresponding locations within memory banks $M_0$-$M_K$ will store the same partially written data values. However, after the write cache 902 is filled in this manner, a subsequent write operation will necessarily hit the write cache 902, thereby allowing the new write operation to be handled in the manner described above, without the loss of any information.

In one embodiment, access controller 901 keeps track of the age of each valid entry of write cache 902. If the age of the oldest valid entry of write cache 902 exceeds a predetermined number of cycles N, access controller 901 forces an idle cycle to allow this oldest valid entry to be retired to the associated memory bank. In this embodiment, N is selected to correspond with the maximum number of cycles that the second write operation may be delayed, while still allowing the second write operation to pull the storage nodes of the associated bit cells to the full supply voltages ($V_{DD}$ and $V_{SS}$).

Upon receiving a read access request, access controller 901 accesses write cache 902 using the word/row address of the associated read address. More specifically, access controller 901 retrieves the valid bit, the bank address and the write data value from the location of the write cache 902 specified by the read address. If the retrieved valid bit is activated, and the retrieved bank address matches the bank address specified by the read access request, then the read access request has hit the write cache 902, and the write data value retrieved from the write cache is provided as the read data value. Note that this creates an idle cycle within memory banks $M_0$-$M_K$, wherein the oldest pending partial write operation may be completed. Note that two pending partial write operations may be completed during this idle cycle, as long as these pending write operations exist within separate ones of the memory banks $M_0$-$M_K$.

If the retrieved valid bit is not activated, or the retrieved valid bit is activated, and the retrieved bank address does not match the bank address specified by the read access request, then the read access request has missed the write cache 902. In this case, the read data value is retrieved from the memory bank specified by the read access request on bus structure 505. Note that this creates an idle cycle within the memory banks other than the memory bank being read, such that access controller 901 may complete the oldest pending partial write operation on bus structure 905 during the same cycle.

Figure 10:
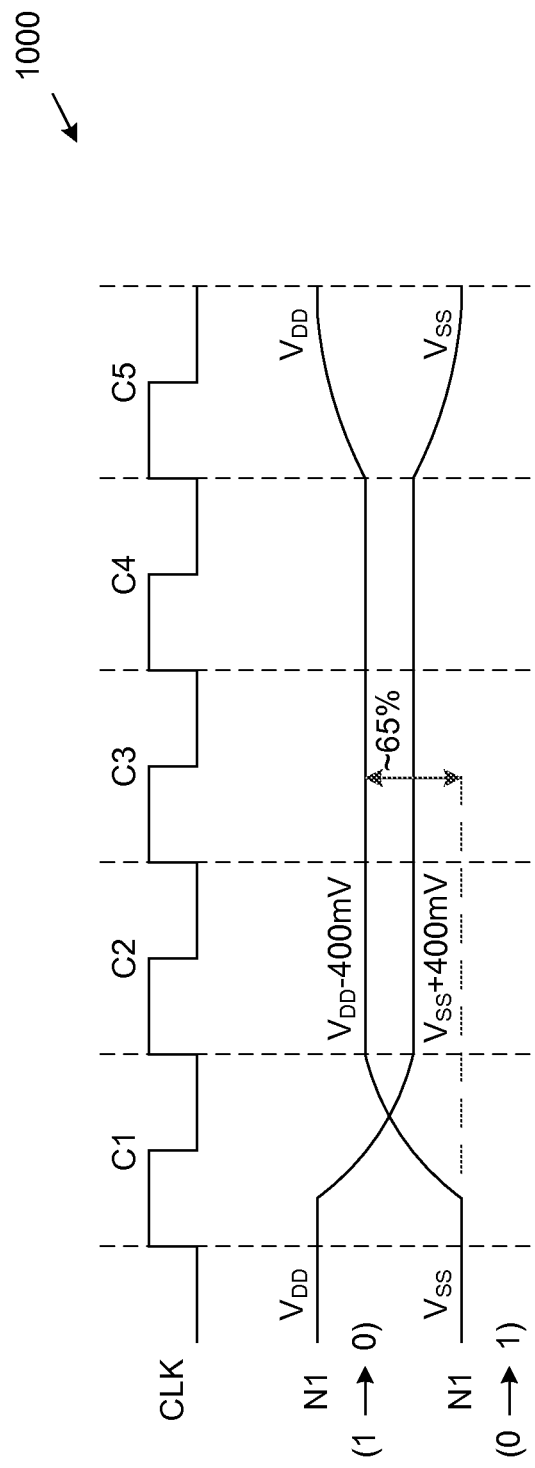
FIG. 10 is a waveform diagram illustrating storage node voltages associated with an incomplete/partial write operation that is performed during a first cycle, but is not completed until a subsequent cycle, cycle 5 in the example, in accordance with the second embodiment of the invention.

FIG. 10 is a waveform diagram 1000 illustrating the storage node voltages associated with an incomplete/partial write operation that is performed during a first cycle C1, but is not completed until a subsequent cycle C5, due to intervening accesses during cycles C2-C4.

Thus, when the storage node N1 initially stores a logic "1" data bit, and a logic "0" data bit is then written to the storage node N1 (i.e., N1 (1→0)), the voltage on the storage node N1 is initially pulled down from the $V_{DD}$ supply voltage to $V_{SS}$+400 mV during cycle C1 (i.e., about 65% of the way from the $V_{DD}$ supply voltage to the $V_{SS}$ supply voltage), and is then pulled down from $V_{SS}$+400 mV to the $V_{SS}$ supply voltage during cycle C5. Similarly, when the storage node N1 initially stores a logic "0" data bit, and a logic "1" data bit is then written to the storage node N1 (i.e., N1 (0→1)), the voltage on the storage node N1 is initially pulled up from the $V_{SS}$ supply voltage to $V_{DD}$−400 mV during cycle C1 (i.e., about 65% of the way from the $V_{SS}$ supply voltage to the $V_{DD}$ supply voltage), and is then pulled up from $V_{DD}$−400 mV to the $V_{DD}$ supply voltage during cycle C5.

Although the invention has been described in connection with several embodiments, it is understood that this invention is not limited to the embodiments disclosed, but is capable of various modifications, which would be apparent to a person skilled in the art. Accordingly, the present invention is limited only by the following claims.

I claim:

1. A method of operating a memory system having a plurality of memory banks comprising:
   performing an incomplete write operation of a first data value to a first address location in a first memory bank during a first memory cycle, wherein the incomplete write operation fails to pull a storage node of a memory cell at the first address location all the way to a first voltage associated with a first data state; and
   performing a write operation of the first data value to a first address location in a cache memory during the first memory cycle.

2. The method of claim 1, further comprising:
   determining that there are no required accesses to the first memory bank during a second memory cycle; and
   retrieving the first data value from the cache memory and writing this retrieved first data value to the first address location in the first memory bank during the second memory cycle.

3. The method of claim 2, further comprising
   performing an incomplete write operation of a second data value to a second address location in a second memory bank during a second memory cycle; and
   performing a write operation of the second data value to a second address location in the cache memory during the second memory cycle.

4. The method of claim 2, further comprising reading the first data value from the first address location in the cache memory during the second memory cycle.

5. The method of claim 2, further comprising reading a second data value from a second memory bank during the second memory cycle.

6. The method of claim 1, further comprising:
   performing an incomplete write operation of a second data value to a second address location in the first memory bank during a second memory cycle, wherein the incomplete write operation fails to pull a storage node of a memory cell at the second address location all the way to the first voltage associated with the first data state; and
   performing a write operation of the second data value to a second address location in the cache memory during the second memory cycle.

* * * * *